United States Patent [19]

Nakanishi

[11] Patent Number: 5,217,908
[45] Date of Patent: Jun. 8, 1993

[54] SEMICONDUCTOR DEVICE HAVING AN INSULATOR FILM OF SILICON OXIDE IN WHICH OH IONS ARE INCORPORATED

[75] Inventor: Toshiro Nakanishi, Kamakura, Japan
[73] Assignee: Fujitsu Limited, Kawasaki, Japan
[21] Appl. No.: 718,381
[22] Filed: Jun. 20, 1991

[30] Foreign Application Priority Data

Jun. 20, 1990 [JP] Japan .................................. 2-162039

[51] Int. Cl.5 .......................................... H01L 21/265
[52] U.S. Cl. ............................................ 437/24; 437/37
[58] Field of Search ...................... 437/24, 959, 11, 37

[56] References Cited

U.S. PATENT DOCUMENTS

| 4,837,172 | 6/1989 | Mizuno et al. | 437/24 |
| 4,975,126 | 12/1990 | Margail et al. | 437/24 |
| 5,077,225 | 12/1991 | Lee | 437/24 |

FOREIGN PATENT DOCUMENTS

| 150274 | 8/1981 | German Democratic Rep. ... 437/37 |
| 53-121466 | 10/1978 | Japan . |
| 61-142755 | 6/1986 | Japan .................................. 437/24 |
| 62-166528 | 7/1987 | Japan .................................. 437/24 |
| 63-202033 | 8/1988 | Japan .................................. 437/24 |
| 1-199456 | 8/1989 | Japan .................................. 437/24 |

*Primary Examiner*—Olik Chaudhuri
*Assistant Examiner*—Ourmazd S. Ojan
*Attorney, Agent, or Firm*—Staas & Halsey

[57] ABSTRACT

A method for fabricating a semiconductor device comprises the steps of providing an oxide film containing silicon and oxygen on a substrate, introducing species containing oxygen into the oxide film by an ion implantation process, and providing an electrode on the oxide film.

13 Claims, 13 Drawing Sheets

SEMICONDUCTOR DEVICE HAVING AN INSULATOR FILM OF SILICON OXIDE IN WHICH OH IONS ARE INCORPORATED

BACKGROUND OF THE INVENTION

The present invention generally relates to semiconductor devices and more particularly to a fabrication process for a semiconductor device that has an insulating film of silicon dioxide.

Various semiconductor devices utilize silicon oxide for the insulating film. For example, the silicon oxide film is used for the gate insulating film of MOS transistors or for the dielectric layer of storage capacitors of memory cells. Such silicon oxide films may be formed by the CVD process or thermal annealing process on a silicon substrate made in the oxidizing atmosphere.

With the requirement of reduced size and increased integration density of semiconductor devices, the thickness of the silicon oxide film is reduced progressively, and according to the scaling law. This in turn invites the concentration of the electric field in the thin oxide film that eventually leads to the breakdown of the film caused by the current flowing therethrough.

FIGS. 1(A)–1(C) show the band diagram of a conventional MOS diode under a biased state.

Referring to the structure shown in FIG. 1(A), the MOS diode comprises a p-type silicon substrate 11, a silicon oxide film 12 grown on the substrate 11, and a doped polysilicon electrode 13 grown further on the silicon oxide film 12. Upon the negative and positive biasing applied by a voltage source V across the silicon substrate 11 and the polysilicon electrode 13, the conduction band Ec and the valence band Ev of the silicon substrate 11 curve variously at the interface between the silicon substrate 11 and the silicon oxide film 12. Thereby, there appear various states of the band structure, such as the accumulation state or the inversion state, as is well known in the art.

FIG. 1(A) shows the accumulation state in which a negative voltage is applied to the electrode 13 of the MOS diode. In this state, a large electric field is induced in the silicon oxide film 12 as a result of the negative biasing. It will be easily understood that the intensity of the electric field in the silicon oxide film 12, represented by the gradient of the conduction and valence bands, increases with decreasing thickness of the film 12.

When the quality of the silicon oxide film 12 is ideal, no injection of electrons occurs from the polysilicon electrode 13 to the silicon oxide film 12, unless the applied bias voltage becomes extremely large and the effective barrier width H1 shown in FIG. 1(A) decreases to a size that allows the tunneling of electrons. However, an actual silicon oxide film 12 generally includes various defects therein and it is inevitable that small amount of electrons is injected into the film 12 through the energy levels pertinent to these defects.

Once the electrons are injected, they experience acceleration due to the large electric field established in the film 12. This acceleration of electrons is particularly conspicuous in the devices that have a thin silicon oxide film. Thereby, the electrons cause impact ionization upon collision with the atoms forming the silicon dioxide, and such impact ionization induces formation of the hole-electron pairs. Generally, the electrons thus formed escape to the silicon substrate relatively easily due to their high mobility, while there is a tendency that the holes thus formed are trapped in the silicon oxide film 12 because of their low mobility. This effect is not significant at the beginning of device operation, as the leakage of current through the silicon oxide film 12 is extremely small at the beginning. However, the continuous use of the device inevitably invites accumulation of the holes in the silicon oxide film 12, and such holes trapped in the film 12 tend to lower the energy level of the conduction band as well as the valence band thereof. Thereby, the conduction band Ec and the valence band Ev of the silicon oxide film 12 are curved downward as shown in FIG. 1(B), and the effective barrier width H2 is inevitably decreased.

With further accumulation of the holes, the effective barrier width H2 of the silicon oxide film 12 decreases further, and the probability of electrons tunneling through the silicon oxide film 12 increases. There, the electrons at the Fermi level $E_F$ of the gate 13 reach the conduction band Ec of the silicon oxide film 12 and flow to the silicon substrate 11 with finite probability. Each of these electrons experiences acceleration produced by the large electric field in the silicon oxide film 12 and induces new hole-electron pair formation by the impact ionization. Thereby, the concentration of the holes accumulated in the silicon oxide film 12 increases with such acceleration, and the MOS diode ultimately reaches a state shown in FIG. 1(C) wherein the silicon oxide film 12 no longer works as effective barrier. In this state, the MOS diode is broken down. It should be noted that the transition from the state of FIG. 1(B) to FIG. 1(C) occurs in an extremely short time period. This accumulation of the holes in the silicon oxide film is believed to be one of the major causes that decreases the lifetime of the MOS diodes or MOS transistors. It should be noted that the above argument applies also to the case of other semiconductor devices which use a insulating silicon oxide film, such as memory cells.

Conventionally, it has been known that the addition of chlorine or fluorine ions at the time of formation of the silicon oxide film contributes to the improvement of the quality of the obtained oxide film. Further, it is reported in the Japanese Laid-open Patent Application 53-121466 that the ion implantation of Cl ions into the silicon oxide film is effective for removing the impurities from the oxide film and for improving the quality of the film. However, as will be described later, it was found that the incorporation of Cl ions in the silicon oxide film causes a wide scattering of the breakdown voltage. Such a process is unreliable and cannot be accepted for the practical fabrication process of semiconductor devices.

SUMMARY OF THE INVENTION

Accordingly, it is a general object of the present invention to provide a novel and useful semiconductor device in which the foregoing problems are eliminated.

Another and more specific object of the present invention is to provide a process for fabricating a semiconductor device that has an insulating film containing silicon, wherein the problem of accumulation of holes in the insulating film is eliminated.

Another object of the present invention is to provide a process for fabricating a semiconductor device having an insulating film containing silicon, wherein the process includes a step of introducing species that contains oxygen into the insulating film. According to the present invention, the lifetime of the semiconductor device is increased and the reliability of the device is improved.

It is believed, though not proven, that these species incorporated into the insulating film annihilate the sites in the film where the holes tend to be trapped.

Other objects and further features of the present invention will become apparent from the following detailed description when read in conjunction with the attached drawings.

DETAILED DESCRIPTION

FIGS. 2(A)–2(E) show the process for fabricating a semiconductor device according to a first embodiment of the present invention. In the description below, the process will be explained for a MOS diode in correspondence to the description of the prior art. However, it should be realized that the present invention is by no means limited to the MOS diode but is applicable to devices of other types as well.

Figure 1A:
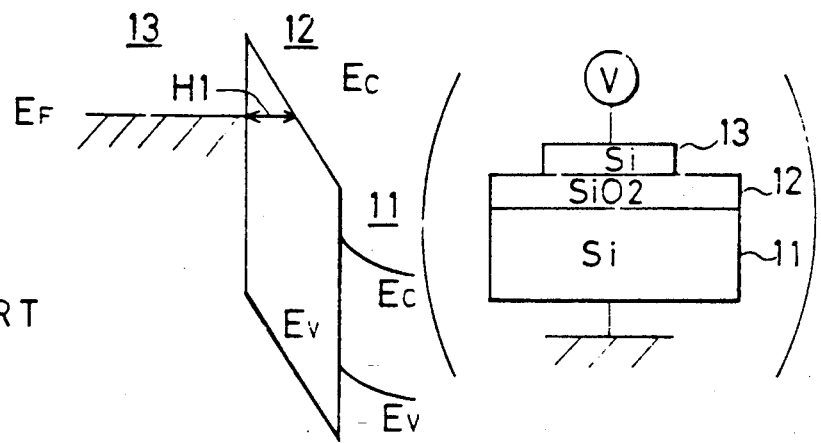
FIGS. 1(A)–1(C) are diagrams showing the band structure of a conventional MOS diode.
Figure 1B:
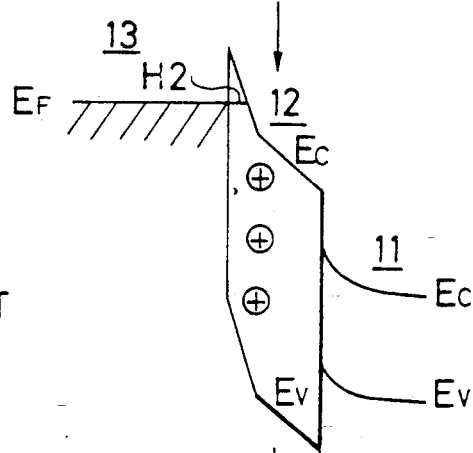
Figure 1C:
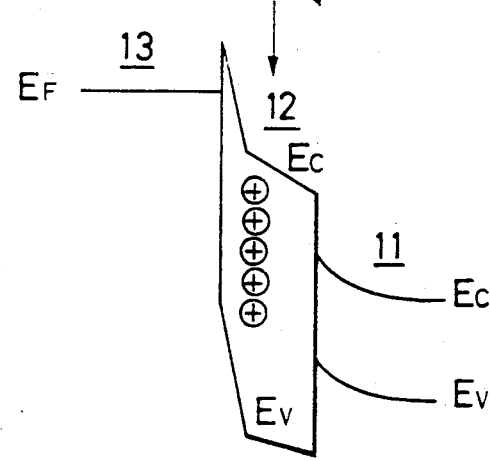
Figure 2A:
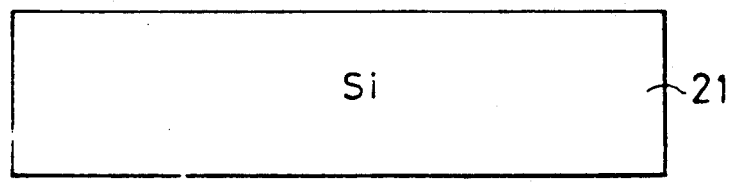
FIGS. 2(A)–2(E) are diagrams showing the process for fabrication of a MOS device according to a first embodiment of the present invention.
Figure 2B:
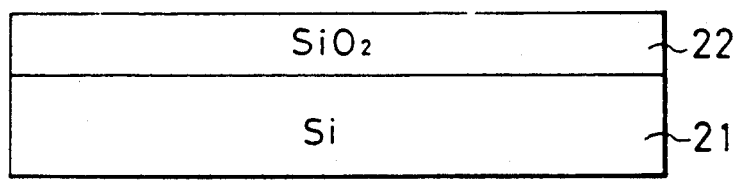
Figure 2C:
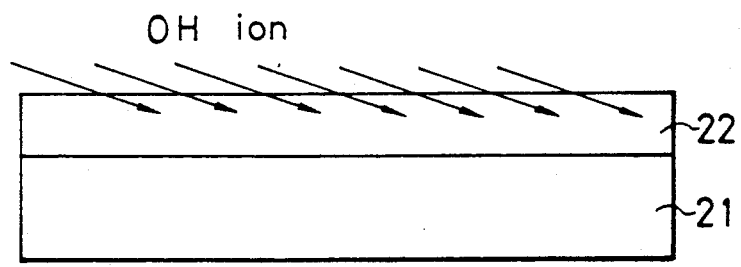

Referring to FIG. 2(A), a silicon substrate 21 is subjected to a thermal oxidation process at 1000° C. for 10 minutes in a dry $O_2$ environment. Thereby a silicon oxide film 22 is formed on the upper major surface of the substrate 21 as shown in FIG. 2(B) with a thickness of 20 nm.

Next, an ion implantation of OH ions is conducted with the incidence angle of 7 degrees and the energy of 10 keV. Thereby, a profile of OH ions shown by a broken line in FIG. 2(D) is obtained wherein the OH ions thus implanted distribute with a peak concentration $R_P$ located approximately at the central level of the layer 22.

Figure 2D:
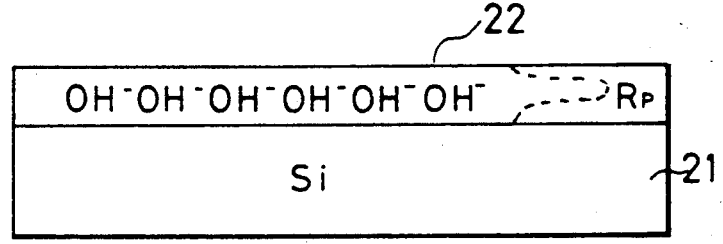
Figure 2E:
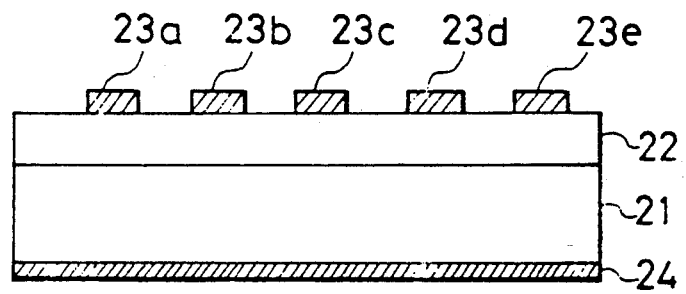

On the top surface of the structure of FIG. 2(D), an aluminum layer is deposited by an evaporation process with a thickness of 0.5 $\mu$m, and then patterned to form a number of electrodes 23a–23e shown in FIG. 2(E), each having a rectangular form with the area of 0.09 $cm^2$. Further, a back-side electrode 24 also of aluminum is provided on the bottom surface of the substrate 21 with the thickness of 0.5 $\mu$m. Further, the structure thus obtained is subjected to a thermal annealing process conducted at 400° C. for 30 minutes in the atmosphere of nitrogen containing 5% of hydrogen. In this device, therefore, a number of MOS diodes are formed in the row and column formation when viewed in the direction perpendicular to the upper surface of the silicon oxide film 22.

Figure 3:
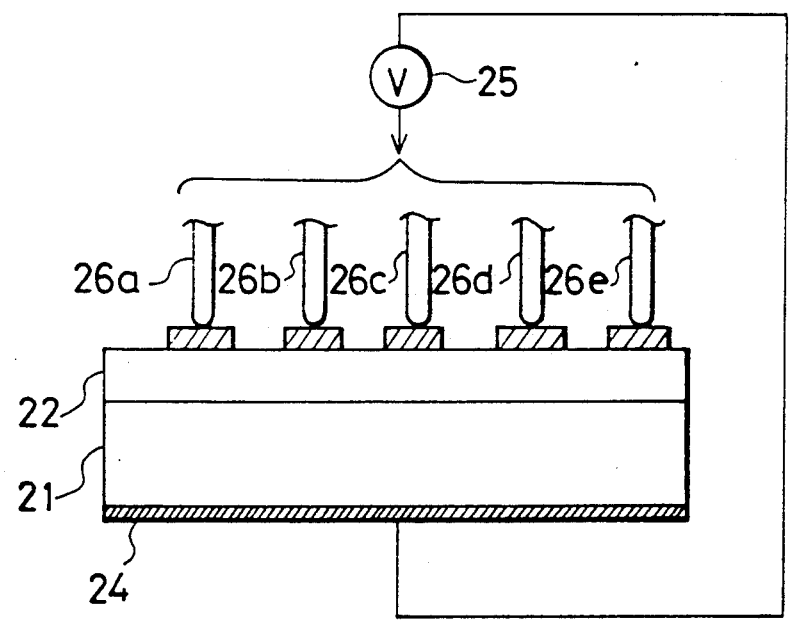
FIG. 3 is a diagram showing the completed MOS device and a fixture for measuring the quality of the MOS device formed by the first embodiment of the process of the present invention.

The MOS diode thus obtained is subjected to an endurance test wherein a bias voltage V from a voltage source 25 is applied to the electrodes 23a–23e via respective contact probes 26a–26e as shown in FIG. 3.

Figure 4:
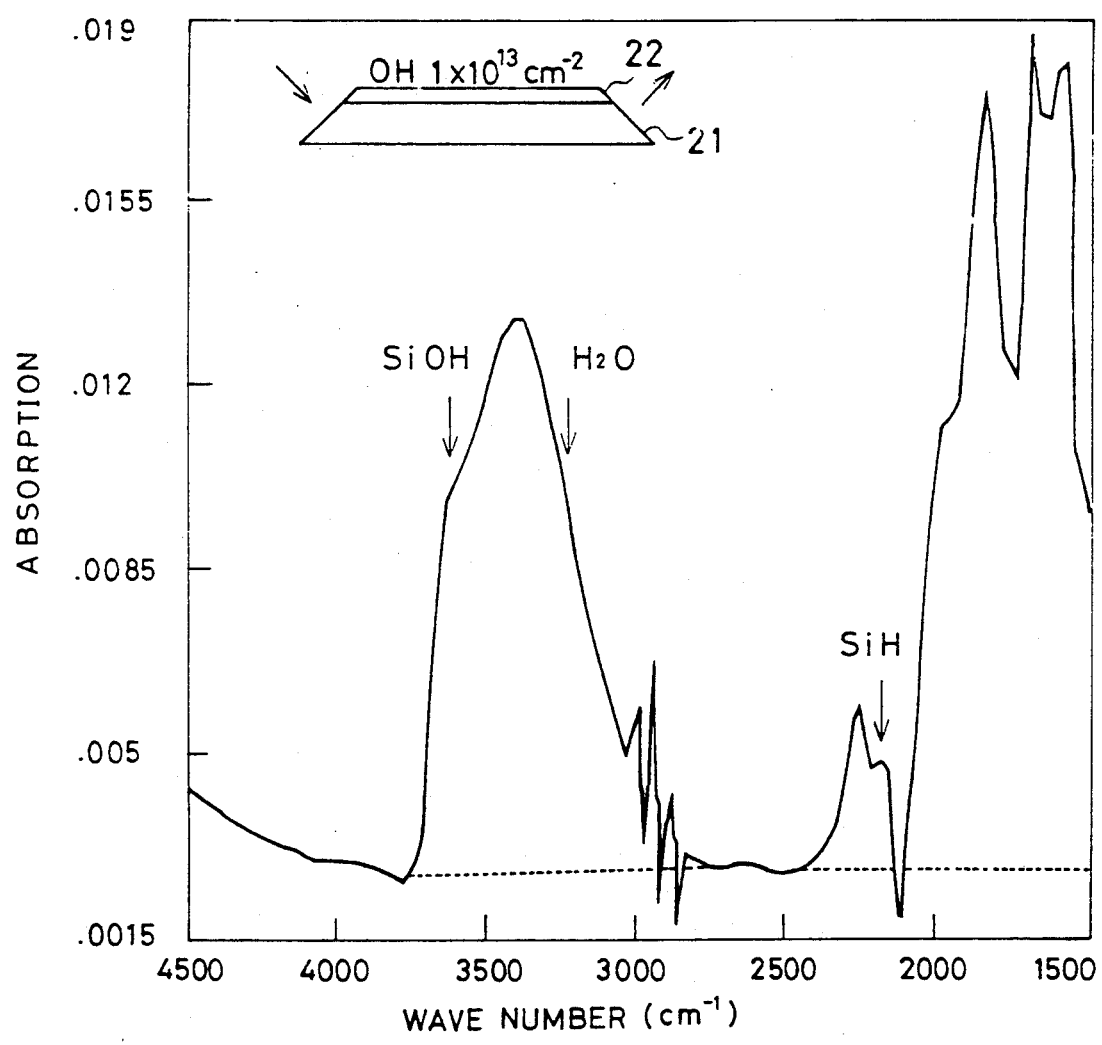
FIG. 4 is a diagram showing the IR absorption spectrum of the insulator film used in the MOS device of FIG. 3.

FIG. 4 shows the FTIR-ATR absorption spectrum of the silicon oxide film 22 grown on the silicon substrate 21. The result of FIG. 4 is obtained for the silicon oxide film 22 in which the OH ions are introduced with the dose of $1 \times 10^{13}$ $cm^{-2}$. As shown in the upper area of FIG. 4, the measurement was made using an infrared light beam incident on the substrate 21 at one end thereof and exiting from the substrate 21 at the other end thereof. During incidence and exiting, the light beam experiences reflections between the upper and lower surfaces of the substrate 21 about 50 times. In FIG. 4, the absorption caused by various species or bonding existing in the silicon oxide film is represented by arrows.

Figure 5:
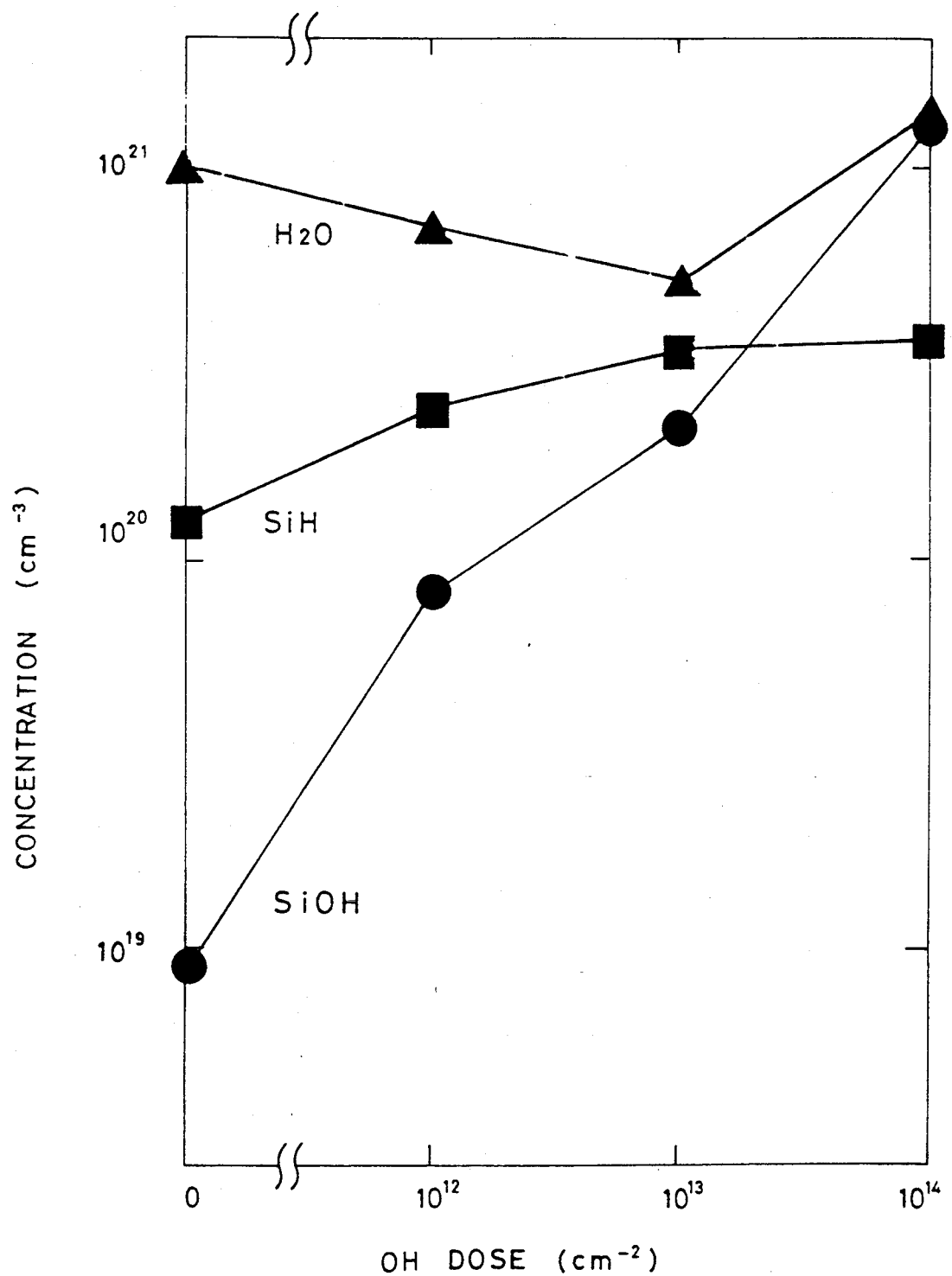
FIG. 5 is a diagram showing the concentration of various bonds in the insulator film as a function of the dose of OH ions in the insulator film.

FIG. 5 shows the concentration of various bonds, deduced from the absorption spectrum of FIG. 4 as a function of the OH ions dose level. The reduction of data was made based upon the process described by Pliskin, W. A., J. Vac. Sci. Technol. Vol.14, No.5, September/October 1977 and by Lanford W. A. et al., J. Appl. Phys. 49(4), April, 1978, which are incorporated herein by reference. As can be seen clearly, one can observe the existence of silanol group SiOH in the structure, of which the concentration thereof increases sharply with an increasing dose level of OH ions. In view of the fact that the concentration of $H_2O$ and SiH does not change substantially with the dose of OH ions, it is safely concluded that the change in the concentration of SiOH is caused by the ion implantation of OH ions.

Figure 6:
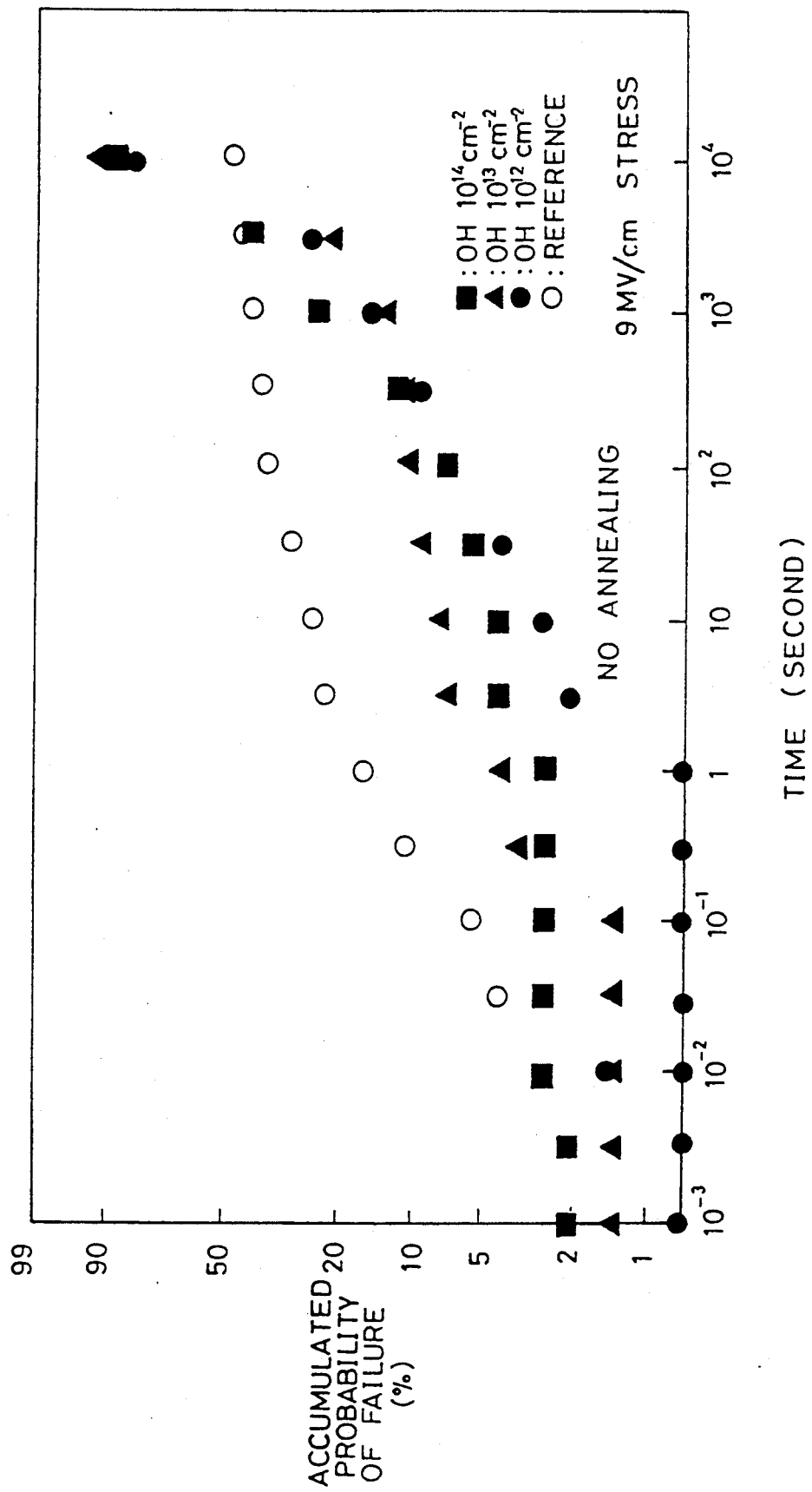
FIG. 6 is a diagram showing the result of a reliability test conducted for the device of FIG. 3, representing the accumulated probability of device failure as a function of the time elapsed from the start of the test.

FIG. 6 shows the result of the endurance test or time-dependent dielectric breakdown (TDDB) test conducted on the MOS diodes thus obtained. The test was made by the fixture of FIG. 3, wherein the proportion of the defective devices is measured with time while applying continuously an electrical stress of 9 MV/cm. As is clearly seen in FIG. 6, the devices designated by solid squares, solid triangles and solid circles that have the silicon oxide film in which OH⁻ ions are incorporated, respectively with the dose of $10^{14}$ cm$^{-2}$, $10^{13}$ cm$^{-2}$ and $10^{12}$ cm$^{-2}$, show a significantly reduced probability of failure as compared with the reference device designated by open circles in which no such implantation of OH ions was made into the silicon oxide film. In comparison to the other data, the data for the device represented by the solid circles represents the most preferable result.

This result indicates that the incorporation of OH ions into the silicon oxide film 22 is effective in suppressing the breakdown of the semiconductor device that uses such silicon oxide film. It is believed, though not proven yet, that OH ions thus implanted into the silicon oxide film eliminate the sites in the silicon oxide film that work to trap holes by terminating the dangling bonds or other defects in the silicon oxide structure.

With the foregoing mechanism in mind, the inventor of the present invention made experiments in which Cl and F ions are implanted into the silicon oxide film of a MOS diode.

Figure 7:
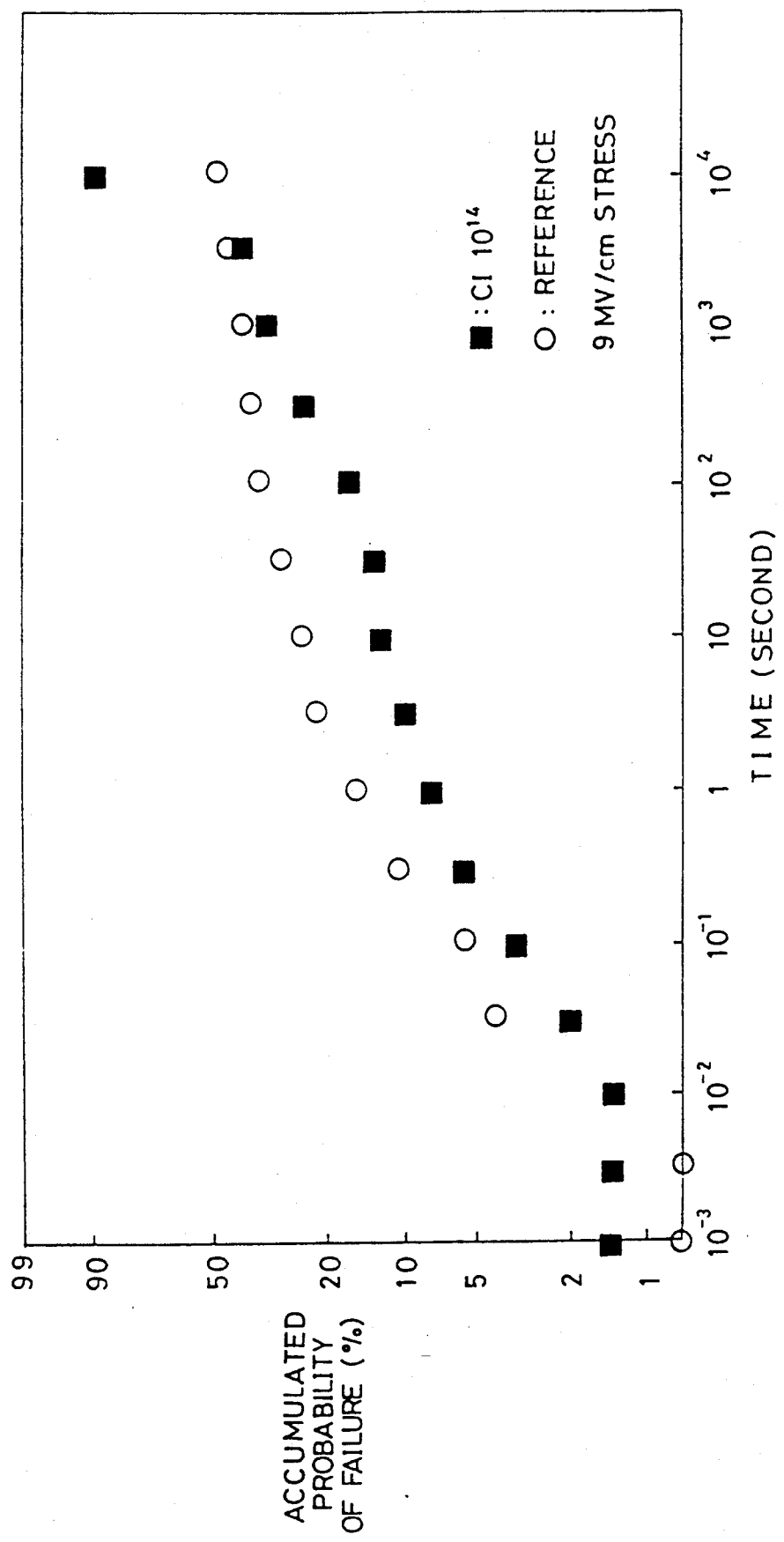
FIG. 7 is a diagram similar to FIG. 6 showing the result of the reliability test conducted for a device similar to FIG. 3 except that Cl ions are incorporated instead of OH ions in the insulator film.

FIG. 7 shows the result of TDDB test for the MOS device having a structure identical to that of the device of FIG. 3 except that the silicon oxide film 22 is subjected to the ion implantation of Cl. As can be seen in FIG. 7, it was found that the incorporation of Cl is also effective in suppressing the probability of failure of the semiconductor device.

Next, the inventor has studied the breakdown characteristic of the MOS device by using the fixture of FIG. 3. In this study, a test was conducted for measuring the breakdown voltage of the device while increasing the voltage V in the fixture of FIG. 3.

Figure 8:
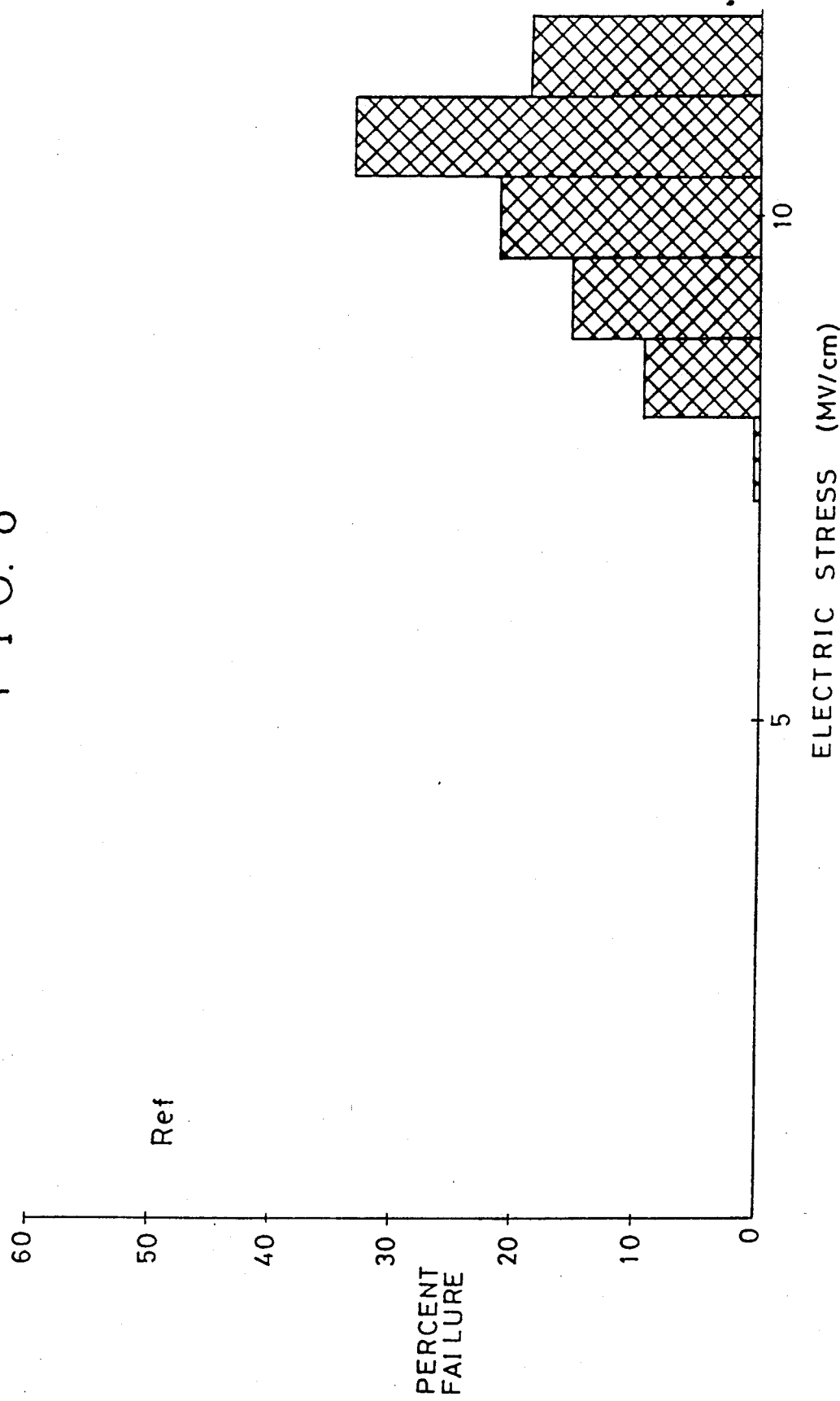
FIG. 8 is a histogram showing the distribution of the breakdown voltages observed for the reference devices each having a structure that is substantially identical with FIG. 3 but without incorporation of OH− in the insulator film.

FIG. 8 shows the result of the test for a reference device wherein no ion implantation was performed on the silicon oxide film 22. In this case, it can be seen that the MOS diode fails generally at the electrical stress of about 11 MV/cm with a modest scattering in the range of ±2 MV/cm.

Figure 9:
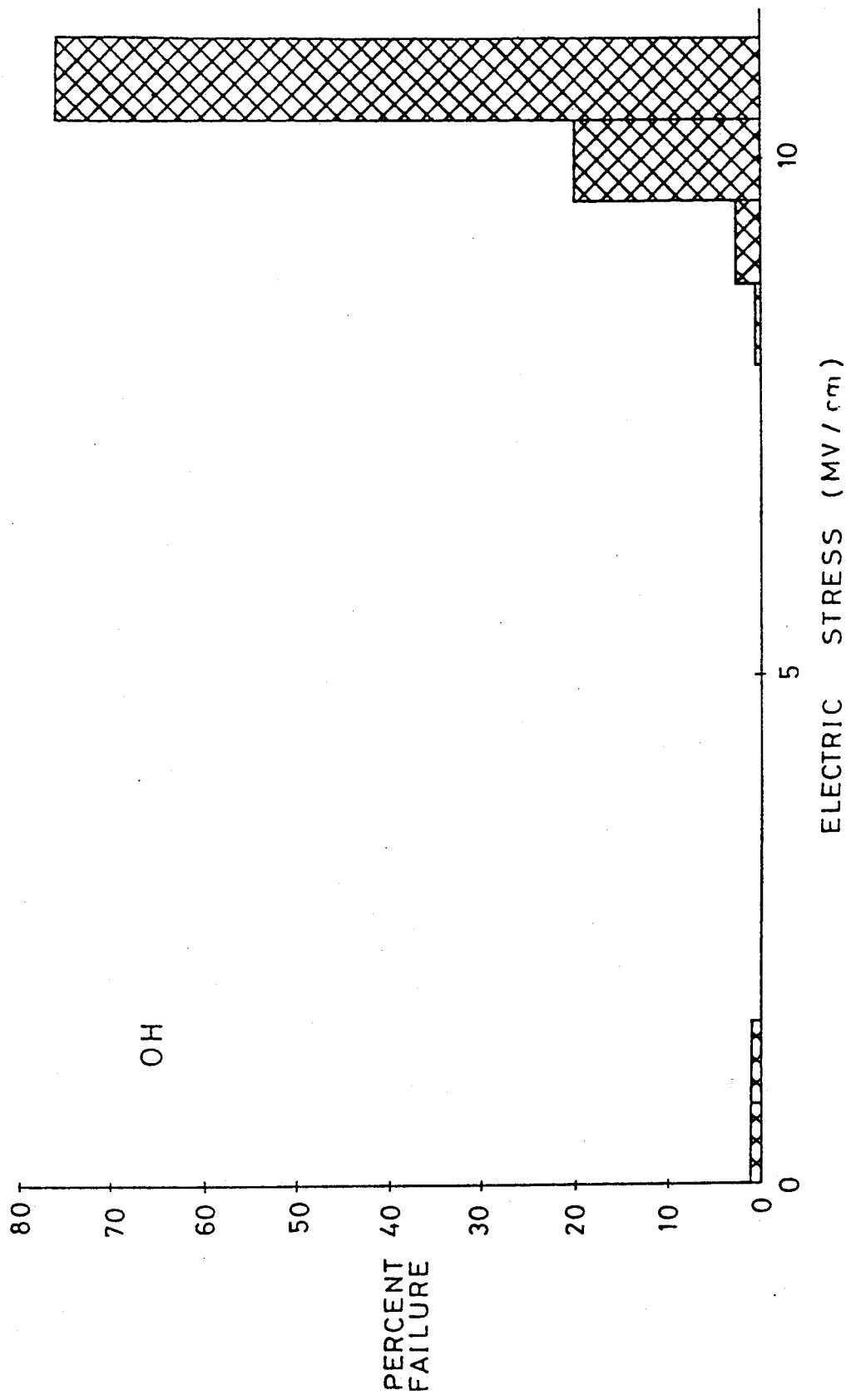
FIG. 9 is a histogram similar to FIG. 8 showing the distribution of the breakdown voltage for the devices fabricated by the first embodiment.

FIG. 9 shows the result of the test for the MOS diode of FIG. 3 wherein OH ions are introduced into the silicon oxide film 22. As can be seen, the MOS device fabricated according to the first embodiment process shows a reduced scattering of the breakdown voltage with respect to a mean value of the electric stress of about 11 MV/cm that is substantially identical with the case of the reference device. Considering the suppression of the accumulated probability of failure as shown in FIG. 6, it is concluded that the ion implantation of OH into the silicon oxide film 22 of the MOS diode of FIG. 3 is quite effective in improving the lifetime, reliability and yield of the device.

Figure 10:
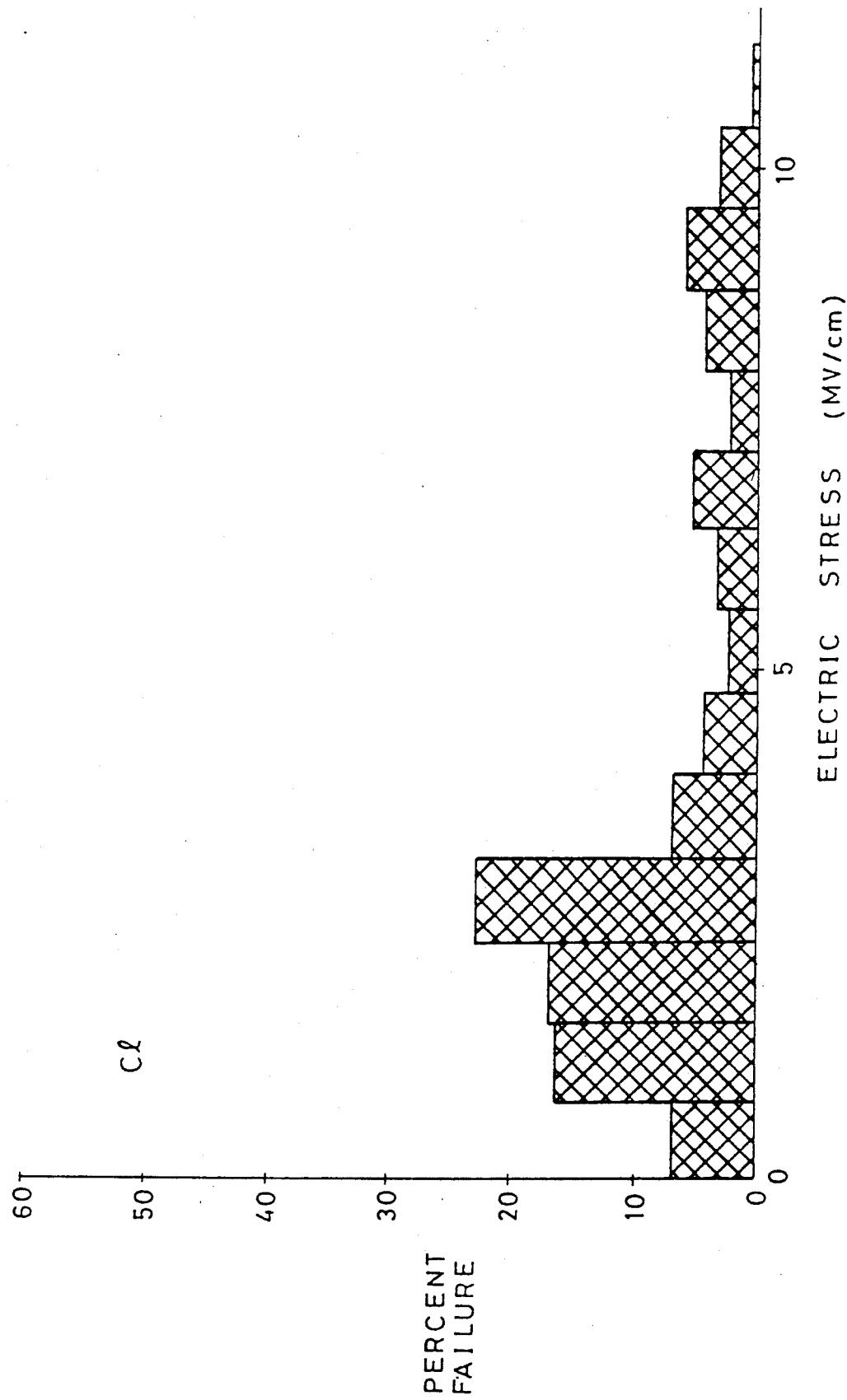
FIG. 10 is a histogram similar to FIG. 8 showing the distribution of the breakdown voltage for the devices that have the insulator film in which Cl ions are incorporated.

FIG. 10 shows the result of the test for the MOS diode of FIG. 3 wherein Cl ions are introduced into the silicon oxide film 22. As can be seen, the breakdown voltage for this device scatters widely in the range from 0-11 MV/cm. This means that the chance that one obtains the device having a satisfactory breakdown voltage is very small, and that the device used in the experiment of FIG. 7 was obtained only as a matter of luck. Thus, it is concluded that the process including the step of ion implantation of Cl ions into the silicon oxide film is definitely inappropriate for the process for fabricating a semiconductor device.

Figure 11:
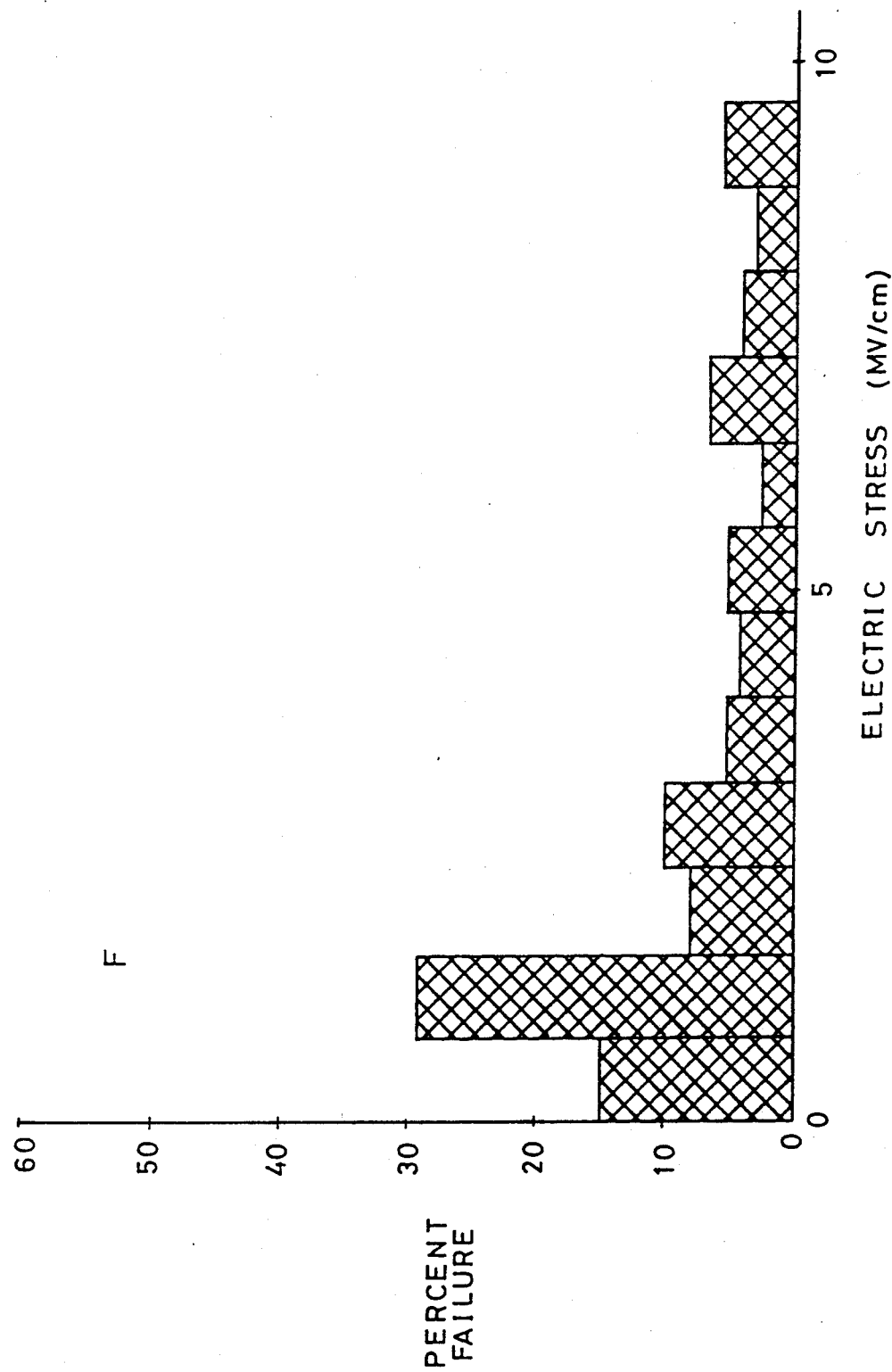
FIG. 11 is a histogram similar to FIG. 8 showing the distribution of the breakdown voltage for the devices that have the insulator film in which F ions are incorporated.

FIG. 11 shows the result of a similar test as in the case of FIG. 9 conducted for the MOS diode wherein F ions are introduced into the silicon oxide film 22 instead of OH ions. As can be seen, the breakdown voltage for this device also scatters widely. Thereby, it is concluded that this process of implanting F ions is also inappropriate as a process for fabricating a semiconductor device.

From FIGS. 9-11, it is deduced that the OH ions incorporated into the silicon oxide film 22 effectively eliminate the sites which act to trap holes by establishing a bond with silicon similarly to the case of oxygen as evidenced by the observation of FIG. 5, while Cl ions cannot establish a similar bond with silicon. In the case of F ions, too, the nature of chemical bond is significantly different from the bond that is established between silicon and oxygen. Thereby, it is believed that Cl or F cannot enter the structure of silicon dioxide but form defects therein, and this is the reason why the breakdown voltage of the device scatters so widely when Cl or F are introduced.

The foregoing observation about the role of OH ions in the structure of silicon oxide film leads to a prediction that the incorporation of oxygen into the silicon oxide film may also be effective in improving the lifetime, reliability and yield of the semiconductor device. Thus, the inventor of the present invention has conducted an investigation about the effect of oxygen ion implantation into the silicon dioxide film for the MOS diode of FIG. 3, which will be explained hereinafter as a second embodiment of the present invention.

Figure 12:
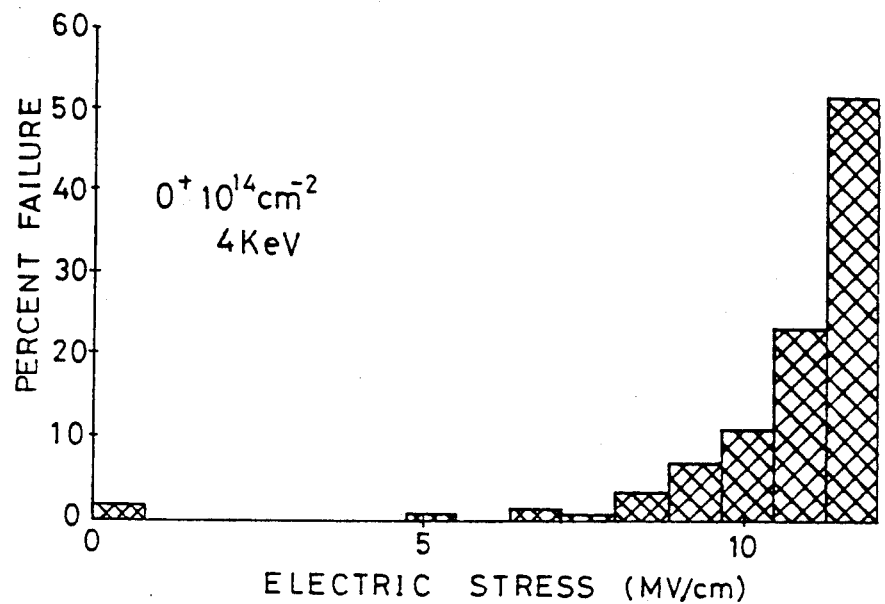
FIGS. 12(A) and 12(B) are histograms showing the distribution of the breakdown voltage for the semiconductor devices fabricated by a second embodiment of the present invention in comparison with the result for the reference devices.
Figure 12:
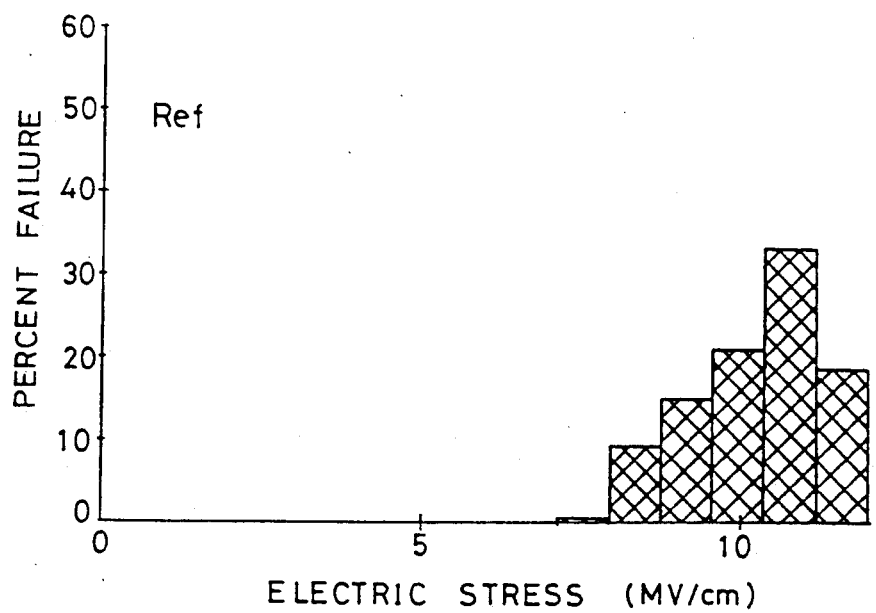

FIG. 12(A) shows the result of the experiment conducted for showing the distribution of the observed breakdown voltage in terms of the electric stress. In this experiment, oxygen ions O⁺ are implanted under an energy of 4 keV with a dose of $10^{14}$ cm$^{-2}$. FIG. 12(B) shows the result for the reference device wherein no such incorporation of oxygen ions is made. As can be seen clearly, the ion implantation of oxygen is also effective in reducing the scattering of the breakdown voltage and hence in improving the reliability of the device.

Figure 13:
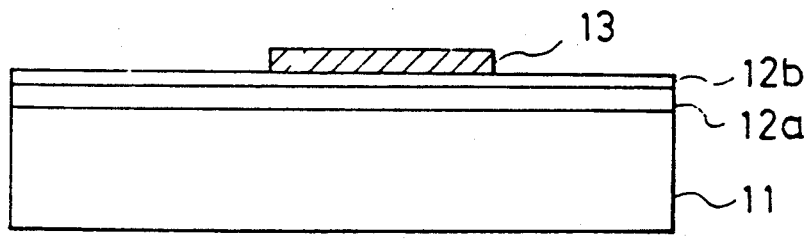
FIG. 13 is a diagram showing the semiconductor device according to a third embodiment of the present invention.

FIG. 13 shows a modification of the semiconductor device wherein a silicon nitride film 12a is provided on the upper major surface of the silicon substrate 11 by the chemical vapor deposition process and the like, and a silicon oxide film 12b is formed on the upper surface of the silicon nitride film 12a by the thermal oxidation of the silicon nitride film. Further, the electrode 13 of aluminum or polysilicon is deposited on the silicon oxide film 12b. The present invention is also effective in improving the lifetime, reliability and yield of the device.

Further, it should be noted that the present invention is not limited to the MOS diode but also applicable to other devices, such as a MOSFET, that have the silicon oxide film to which electric stress is applied.

Further, the present invention is not limited to the embodiments described heretofore, but various variations and modifications may be made without departing from the scope of the invention.

What is claimed is:

1. A method for fabricating a semiconductor device that includes a capacitor, comprising the steps of:
   providing an oxide film containing silicon and oxygen on a substrate as a dielectric film component of said capacitor, the dielectric film having an exposed surface;
   introducing species containing oxygen into the oxide film by ion implantation through the exposed surface of said dielectric film; and
   providing an electrode on the oxide film.

2. A method as claimed in claim 1 in which said method further comprises annealing the oxide film after the ion implantation of said species.

3. A method as claimed in claim 1 in which said species comprises hydroxide ion.

4. A method as claimed in claim 3 in which said species is ion implanted at a dose in the range of $10^{12}$–$10^{14}$ cm$^{-2}$.

5. A method as claimed in claim 4 in which said species is ion implanted at a dose of about $10^{12}$ cm$^{-2}$.

6. A method as claimed in claim 3 in which said species is ion implanted such that the silanol group is formed in the oxide film with a concentration level in the range of $10^{20}$–$10^{21}$ cm$^{-3}$.

7. A method as claimed in claim 1 in which said species comprises oxygen ions.

8. A method as claimed in claim 7 in which said species is ion implanted at a dose of about $10^{14}$ cm$^{-2}$.

9. A method as claimed in claim 3 further comprising implanting said species such that the dose of the species has a maximum value approximately at the central level of the oxide film.

10. A method for improving the electrical breakdown voltage of a dieletric film which comprises a component of a semiconductor device to be formed on a substrate, comprising:
    providing a substrate having a main surface on which is formed an oxide film, containing silicon and oxygen, for use as the dielectric film component of the semiconductor device, the oxide film having a first main surface on the main surface of the substrate and a second, exposed main surface;
    introducing species containing oxygen into the oxide film by ion implantation through the exposed, second main surface of the oxide film; and
    forming an electrode on the second, exposed main surface of the oxide film.

11. The method of claim 10, further comprising forming the oxide film and the electrode as associated components of a capacitor.

12. The method of claim 10, further comprising forming the oxide film and the electrode as associated components of a MOS diode.

13. The method of claim 10, further comprising forming the oxide film and the electrode as associated components of a MOSFET.

* * * * *